United States Patent [19]
Hobbs

[11] Patent Number: 4,951,255
[45] Date of Patent: Aug. 21, 1990

[54] MEMORY CURRENT SINK

[75] Inventor: James B. Hobbs, Minneapolis, Minn.

[73] Assignee: Atmel Corporation, San Jose, Calif.

[21] Appl. No.: 338,708

[22] Filed: Apr. 14, 1989

[51] Int. Cl.[5] .............................................. G11C 13/00
[52] U.S. Cl. ..................................... 365/207; 365/204
[58] Field of Search ................ 365/204, 207, 185, 206

[56] References Cited

U.S. PATENT DOCUMENTS

| | | | |
|---|---|---|---|
| 4,168,490 | 9/1979 | Stinehelfer | 340/166 |
| 4,357,687 | 11/1982 | Rufford | 364/230 |
| 4,366,558 | 12/1982 | Homma et al. | 365/189 |
| 4,393,476 | 7/1983 | Ong | 365/203 |
| 4,463,448 | 7/1984 | Sugo et al. | 365/190 |
| 4,477,885 | 10/1984 | Sharp | 365/204 |
| 4,488,263 | 12/1984 | Herndon et al. | 365/189 |
| 4,488,268 | 12/1984 | Toyoda | 365/203 |
| 4,520,462 | 5/1985 | Yamada | 365/189 |
| 4,539,659 | 9/1984 | Dumont | 365/226 |
| 4,611,303 | 9/1986 | Kitano | 365/230 |

*Primary Examiner*—Terrell W. Fears

[57] ABSTRACT

A discharge circuit for memory cell selection interconnection line pairs with the voltage of one pair member sensed by a sensing means with respect to a reference voltage to control the discharge of the other by a controlled current sink means.

12 Claims, 3 Drawing Sheets

MEMORY CURRENT SINK

The Government has rights in this invention pursuant to Contract No. F33615-84-C-1500, awarded by the Department of the Air Force.

BACKGROUND OF THE INVENTION

The present invention relates to bipolar transistor monolithic integrated circuit memories and, more particularly, to such memories providing random access to the memory cells therein at least in part through selecting a row of such cells from among the rows thereof provided in the integrated circuit.

Monolithic integrated circuit structural features have been shrinking rapidly in size in recent years. As a result, greater numbers of circuit components and circuit portions can be provided in monolithic integrated circuit chips of a size approximately the same as used with earlier technology. The resulting increase in circuit density reduces costs, reduces sizes required for electronic systems, and increases the rapidity of operation of the circuits. The cost reduction has been especially marked in metal-oxide-semiconductor field-effect transistor (MOSFET) based monolithic integrated circuits, but it has also been true of bipolar monolithic integrated circuits which continue to maintain some advantage in rapidity of operation over that achieved by MOS circuits.

One of the impediments to rapid rates of switching in bipolar monolithic integrated circuit memory chips providing random access to the memory cells therein is the need to discharge the capacitances associated with the row or word lines (interconnections) used in operating the rows of memory cells therein. This need arises for specific word lines associated with a memory cell row that had been selected by the address decoder circuitry to which such lines are connected, but which selection thereafter ceases.

The selection of the row of memory cells occurs by the address decoder circuitry raising the voltage on the word lines connected to the selected row of memory cells which, in operating that row, also charges the parasitic capacitances associated therewith. Ending such a selection of a row of memory cells requires that the relatively high selection voltage thereon be lowered, and so the parasitic capacitances connected to that word line must be discharged to the standby voltage level. This discharge should occur as rapidly as possible since satisfactory memory operation makes unacceptable having more than one row of memory cells selected simultaneously beyond a transient switching period by having a relatively high voltage in the word lines connected to each. Thus, the selecting of another row is usually not permitted to occur until the selection of the preceding row of memory cells has proceeded significantly toward termination by the voltage on the word lines connected thereto having reached a sufficiently low level.

The needed discharging of word lines after the termination of the selection of the corresponding row of memory cells is usually aided by the provision of a word line discharge circuit in the monolithic integrated circuit bipolar memory containing these cells. In many instances, these circuits have shortcomings such as requiring overly large circuit components, drawing current out of word lines after the selection of the corresponding row of memory cells has ceased, and drawing currents during such a cessation process that decrease during the process slowing its completion. Several other kinds of problems can also exist with such circuits. Thus, there is a desire for a word line discharge circuit overcoming these problems.

SUMMARY OF THE INVENTION

The present invention provides a discharge circuit for memory cell selection interconnection line pairs with the voltage of one pair member sensed by a sensing means with respect to a reference voltage to control the discharge of the other by a controlled current sink means. There can be one such arrangement provided for each such pair, and they can share a common current sink although each has a separate impedance path control connecting it to that current sink.

DETAILED DESCRIPTION OF THE PREFERRED EMBODIMENTS

Figure 1A:
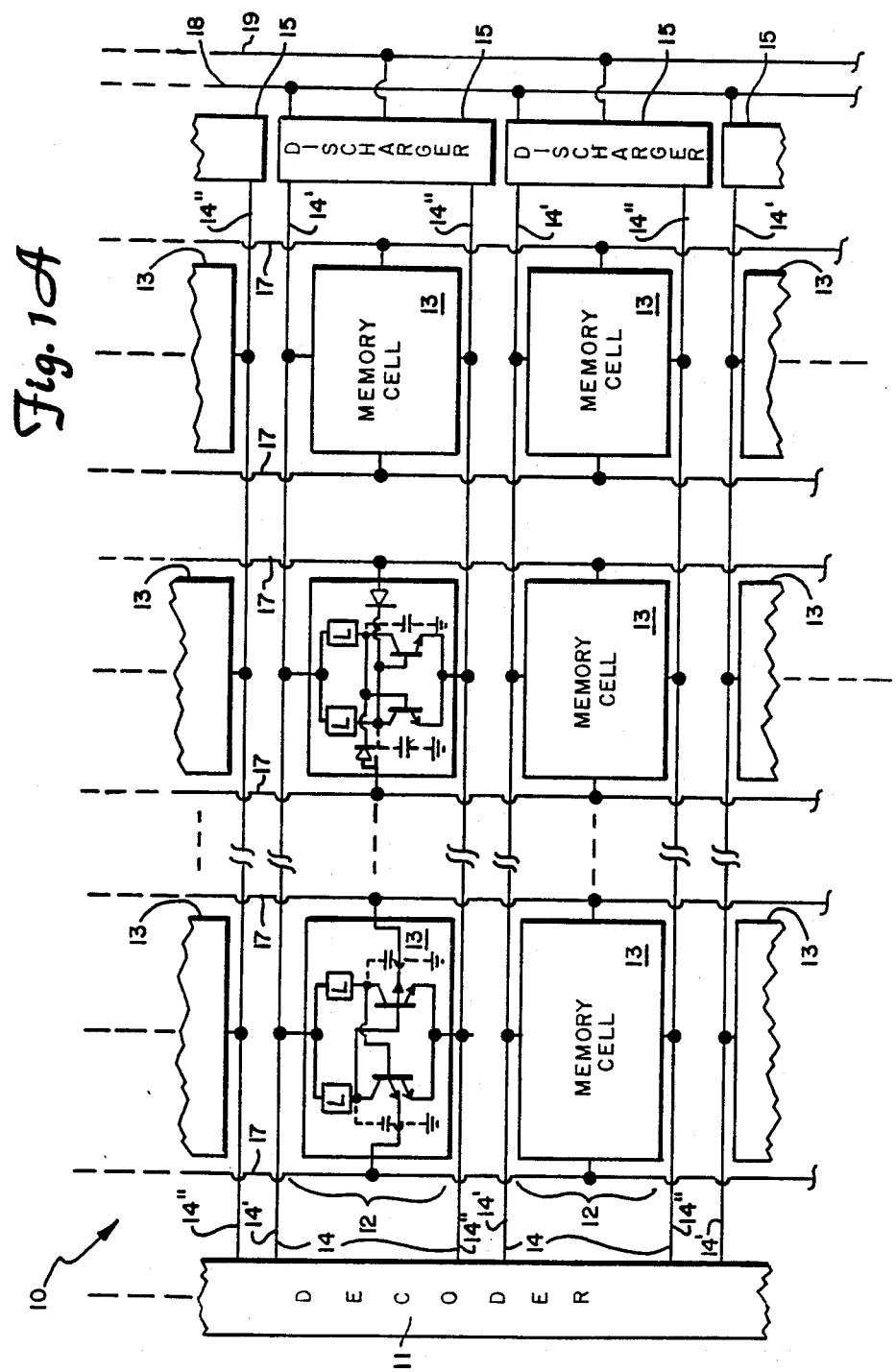
FIGS. 1A and 1B show a block diagram of a memory embodying the present invention.
Figure 1B:
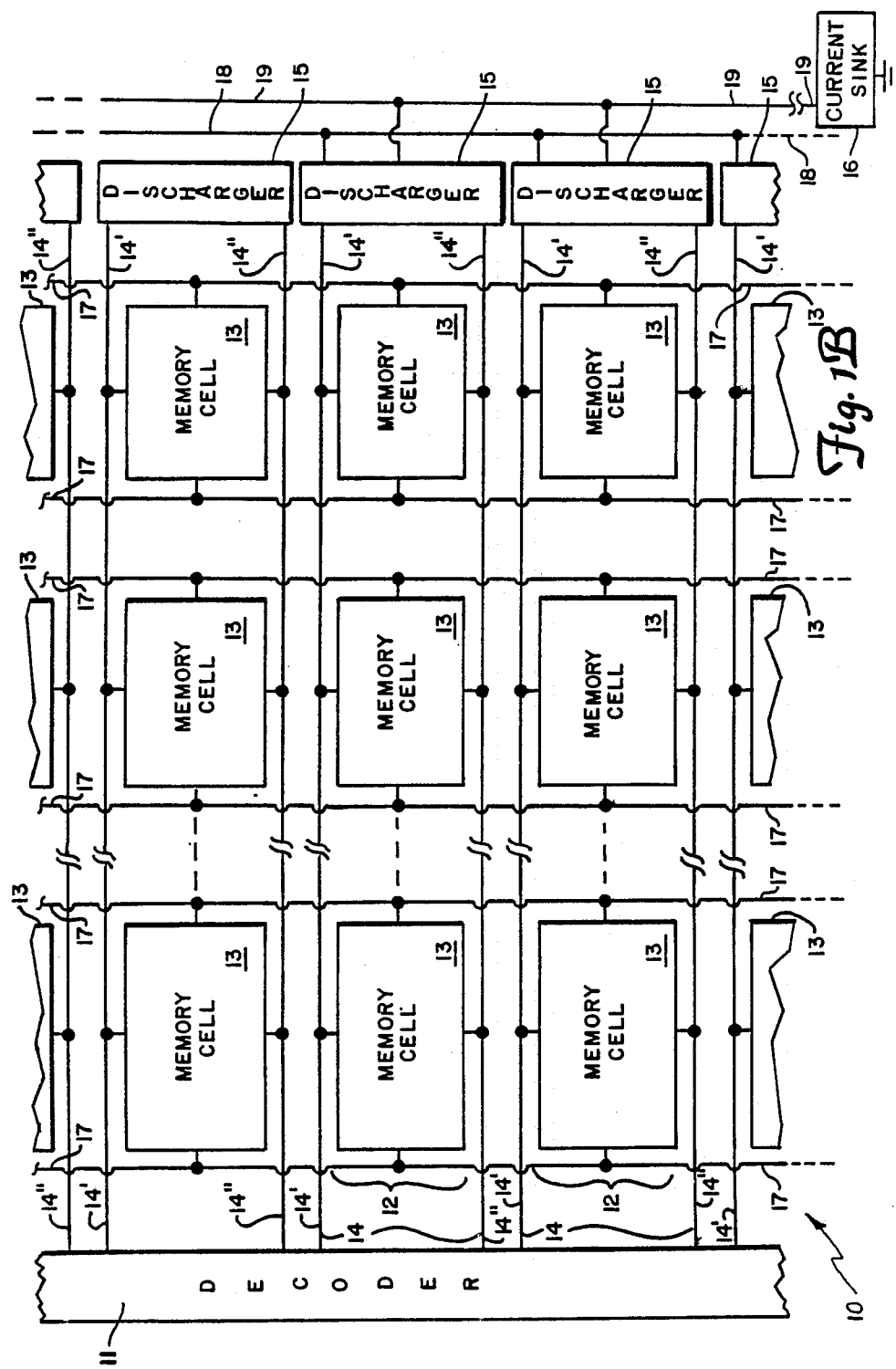

FIGS. 1A and 1B show a portion of a random access memory, 10, in block diagram form. On the left, are shown portions of a decoder, 11, to which a plurality of addressing signals are provided from remaining portions of the digital system using memory 10 through connections not shown. Such addressing signals presented to decoder 11 provide the basis for decoder 11 selecting one of the plurality of rows, 12, of memory cells, 13, provided in memory 10. Each of memory cells 13 is typically a bistable memory cell circuit based on bipolar transistors, two abbreviated examples of which are shown in FIG. 1A. In these examples, the cross-connected bipolar transistors each have a load circuit marked "L" in a box representing that circuit.

Each row 12 of memory cells 13 in FIGS. 1A and 1B has on either side of it a pair of interconnections, 14, leading from decoder 11 between which those memory cells 13 of that row are electrically connected. The upper one of each such pair of row interconnections will be termed a word line, 14', while the bottom interconnection in that pair will be termed a standby line, 14''. Typically, the interconnection members of each row interconnection pair 14 are operated at a relatively low voltage if the row of memory cells 12 therebetween are not selected for a memory operation, with a member word line 14' being typically at 2.2 V and its corresponding member standby line 14'' being at about 1.5 V.

Each interconnection pair member is then switched to a relatively higher voltage when that row 12 of memory cells 13 connected therebetween is selected for a memory operation, such as an information storage or retrieval operation. Pair member word line 14' will typically then be at 3.4 V and pair member standby line 14,, will correspondingly be at 2.6 V. This selection process is controlled by the addressing signals provided to decoder 11 from other portions of the digital system that it is in, which addressing signals cause the decoder to switch between these voltages on the interconnection pairs 14 leading therefrom in correspondence with those addressing signals.

Further connected to each interconnection pair 14 on the right-hand side of FIGS. 1A and 1B is a discharger, 15. This discharger is used to aid in the switching of a pair of memory row lines 14 from a higher voltage after selection of that row 12 connected therebetween to a lower voltage as a result of that row of memory cells 13 being changed from a selected status to a not-selected status. Discharger 15 will be described in greater detail below.

The outputs of dischargers 15 are each connected to a current sink, 16. Current sink 16 is used in connection with the operation of dischargers 15, and also will be described in greater detail below.

Each of memory cells 13 is also electrically connected to a pair of columnar interconnections, 17, leading from a control circuit arrangement in the memory which is not shown. Columnar interconnections 17 are used in operating a memory cell 13 in a selected row 12 thereof both in the storing of information therein and the retrieving of information therefrom. A further vertically oriented interconnection, 18, is shown in FIGS. 1A and 1B connected to each of dischargers 15 for supplying an operating voltage thereto. Finally, the last vertically oriented interconnection, 19, is used to connect the outputs of dischargers 15 to current sink 16.

Two of memory cells 13 in FIG. 1A are shown, as indicated above, with partial schematics of alternative memory cell circuits which, among others, could be used therein. Each, as previously indicated, shows cross-coupled npn bipolar transistors therein to provide the bistable character to the circuit, but with alternative interconnections to its corresponding pair of columnar lines 17. Each also shows in dashed line form parasitic capacitances representing the collector-substrate capacitances of the bipolar transistor that are the primary parasitic capacitances in each row 12 connected to its row line pair 14.

Figure 2:
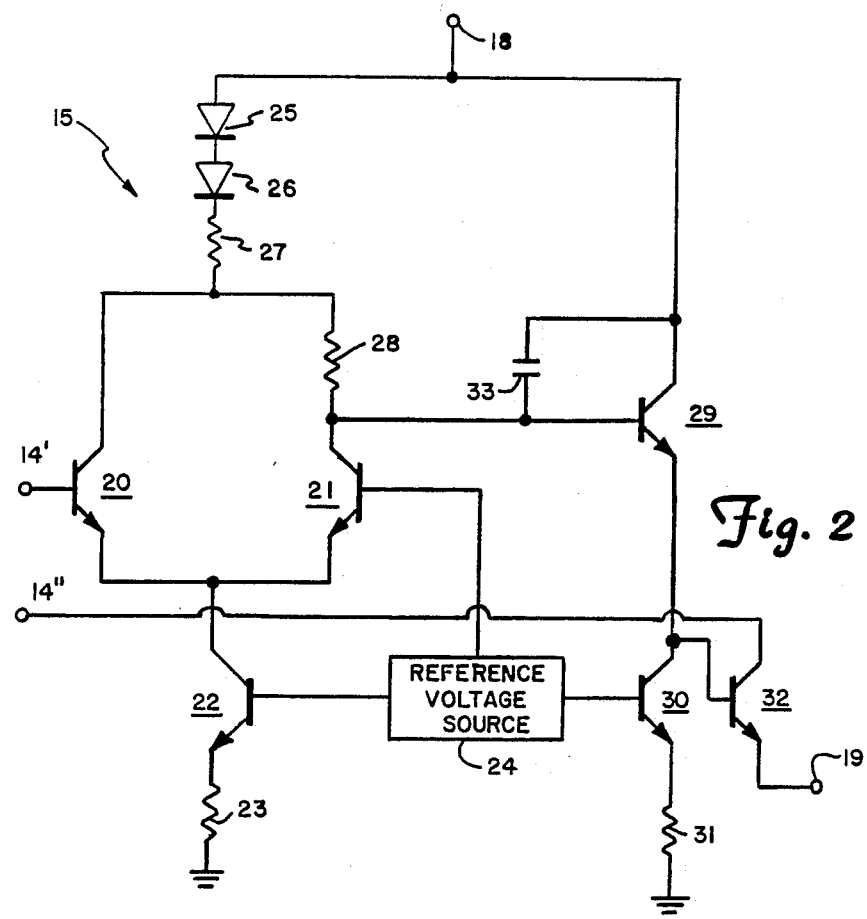
FIG. 2 shows a schematic circuit diagram of a block in FIG. 1.

The circuit schematic for each of dischargers 15 is shown in FIG. 2. Shown on the left are the connection points to the corresponding one of word lines 14' and the corresponding one of standby lines 14" in the particular pair of interconnections 14 to a which discharger 15 is connected. The connection point to voltage supply interconnection 18 is shown at the top of FIG. 2, which supply usually provides a voltage of 5.0 V. Word line 14' is shown connected to the base of an npn bipolar transistor, 20. Input transistor 20 is part of a differential amplifier, and is so paired at its emitter with the emitter of a further npn bipolar transistor, 21. The base of transistor 21 is connected to a source of reference voltages, 24, providing a fixed voltage thereon of typically 2.5 V. The emitters of transistors 20 and 21 are both connected to the collector of a further npn bipolar transistor, 22, having its emitter connected through a resistor, 23, to ground. Resistor 23 has a typical resistance value of 5.3 kΩ.

The base of transistor 22 is connected to source 24 of reference voltages where it receives a varying reference voltage having a typical value of 1.1 V. Transistor 22 and resistor 23, along with the voltage supplied by reference voltage source 24, form a current sink for operating the differential amplifier based on emitter-connected transistors 20 and 21.

The collector of transistor 20 is connected to the voltage supplied on interconnection 18 through a pair of diodes, 25 and 26, and a further resistor, 27, with a typical resistance value of 5.6 kΩ. The collector of transistor 21 is connected through a further resistor, 28, with a resistance value of about 12.0 kΩ, to the collector of transistor 20, and so also to voltage supply interconnection 18 through diodes 25 and 26, and resistor 27. Thus, the collectors of transistors 20 and 21 are operated from a lower voltage than the voltage supplied on interconnection 18. This arrangement reduces the voltage drive to subsequent stages connected to the output of the differential amplifier based on transistors 20 and 21.

The voltage supplied from source 24 to the base of transistor 22 varies in such a manner that the variation in the base-to-emitter voltage of transistor 22 over temperature permits the current that is drawn at the collector of transistor 22 to also vary in such a manner as to counteract the temperature coefficient of resistance of resistor 28 to hold the voltage thereacross in each switching state relatively constant.

The output of this differential amplifier is taken between the collector of transistor 21 and resistor 28 connected thereto, and provided to the base of a further npn bipolar transistor, 29. The collector of transistor 29 is connected directly to voltage supply interconnection 18. The emitter of transistor 29 is connected to a further current sink. Thus, the emitter of transistor 29 is connected to the collector of a further npn bipolar transistor, 30, having its emitter connected through a resistor, 31, to ground. Typically, resistor 31 has a resistance value of 8.0 kΩ. As for the previous current sink, the base of transistor 30 is connected to reference voltage source 24 which supplies a voltage having a value of around 1.3 V, which again varies with temperature to counteract the variation in the base-to-emitter voltage of transistor 30. Again, this provides for a relatively constant current being drawn by the collector of transistor 30. Thus, transistor 29 acts as an emitter follower amplifier having a current sink for its emitter load.

Finally, the output from this emitter follower is taken, of course, at the emitter of transistor 29 and supplied to the base of a further npn bipolar transistor, 32. The collector of transistor 32 is connected to that standby interconnection 14" in the interconnection pair 14 having that word line 14' connected to the base of transistor 20. Transistor 32 is thus the primary discharge path for that standby line. The current drawn from that standby line by transistor 32 is passed through its emitter which is, from FIG. 1, connected to current sink 16. Hence, current drawn by current sink 16 discharges each standby line 14" in each interconnection pair 14 for all of pairs 14 though only during a selection of that pair 14 by decoder 11 and the termination of that selection. This is assured by use of a capacitor, 33, which provides a delay used in extending this discharging for a time after selection has ended. Capacitor 33 is connected between the collector and base of transistor 29.

In operation, one of rows 12 of memory cells 13 will be selected by decoder 11 in response to a corresponding address signal provided to that decoder, this selection being given effect through having the voltage increased on the pair of interconnections 14 connected to that row. The others of rows 12 of memory cells 13 have their corresponding decoder interconnections 14 kept at relatively low voltages. Changing this relatively high voltage state from one of rows 12 to another requires increasing the voltage on the connection pair 14 connected thereto while more or less concurrently decreasing the voltage on that interconnection pair 14 which just previously had a relatively high voltage thereon and which is, of course, connected to that one of rows 12 just previously selected.

Raising the voltage on an interconnection pair 14 can be done quickly even though there is a substantial amount of capacitance, primarily collector-substrate capacitance, as indicated above, associated with these memory cells 13 in that row 12 thereof associated with that interconnection pair. Typically, the voltage increase is supplied through a bipolar transistor emitter follower amplifier in decoder 11 which permits substantial current to flow to quickly charge the capacitances of that row 12 being selected.

On the other hand, reducing the voltage on an interconnection pair 14 associated with an immediately previously selected row 12 of memory cells 13 can be a much slower operation. Typically, the emitter follower amplifier in decoder 11 which had supplied the higher voltage is driven to an "off" condition so that the discharging of the capacitances of that row 12 associated with that interconnection pair 14 must be done by current flowing through those memory cells. However, there is a strong desire to keep small the standby, or normal, memory cell current flow, i.e. the holding current when the cell is not a selected cell, to thereby keep power consumption of memory system 10 relatively low. Thus, there would be a rather long discharge time for discharging the parasitic capacitances of the memory cell connected to a selected interconnection pair 14 connected to a selected row 12 of memory cells 13 if that is to be the only current available for discharging those capacitances at times that row 12 loses its selected status.

Dischargers 15 of FIG. 1 are provided in the memory system to overcome this problem. Each draws a relatively large discharging current from the corresponding standby interconnection 14" connected thereto immediately after a selection of a row 12, if it is connected to that standby line connected in turn to the selected one of rows 12, and does this without drawing current from such other standby lines 14" which are not connected to a selected row 12 of memory cells 13. This discharging current is maintained for a sufficient time to assure the complete discharge of the capacitances associated with an interconnection pair 14 after its status as being connected to a selected row 12 terminates. During a selection of one of rows 12, those dischargers 15 connected to the interconnection pairs 14 connected in turn to the other, unselected ones of rows 12 draw no significant current until the row 12 associated therewith is selected.

Reference voltage source 24 provides a voltage of 2.5 V to the base of transistor 21, as indicated above, a voltage which is just tenths of a volt more than the voltage which appears on word line 14' when the row 12 of memory cells 13 to which it is connected has not been selected by decoder A sufficient difference in these two voltages must be provided in each of dischargers 15 to avoid having any thereof draw a current through those standby lines 14" connected thereto which are ones connected to those of rows 12 which have not been selected by decoder 11.

As will be seen, a voltage on the base of transistor 20 exceeding that on the base of transistor 21 in discharger 15 leads to current being drawn from that standby line 14" to which that discharger 15 is connected. Hence, the voltage on the corresponding word line 14' connected to that discharger, and so which is connected to transistor 20, must be reduced sufficiently below that on the base of transistor 21 to eliminate any current being drawn from standby line 14". The several tenths of a volt difference indicated above is for this purpose. Thus, for voltages on a word line 14' at the value taken when the row 12 to which it is connected has not been selected by decoder 11, discharger 15 will not draw current from its corresponding standby line 14" if this difference is maintained.

This can be seen to be the case since, in these circumstances of the voltage on word line 14' being less than that on the base of transistor 21, transistor 20 will be in the "off" condition with transistor 21 in the "on" condition. As a result, the current drawn by the current sink involving transistor 22 will be drawn essentially through transistor 21 and its collector load, including resistor 28 and resistor 27 with diodes 25 and 26. This will lower the voltage at the collector of transistor 21, and so correspondingly lower the voltage at the base of transistor 29. As a result, transistor 32 will be switched into the "off" condition, and so its collector will in fact draw no significant current from that one of word lines 14' connected thereto In the opposite situation, when that one of rows 12 of memory cells 13 connected to a discharger circuit as in FIG. 2 is selected by decoder 11, the voltage will rise on word line 14' and standby line 14" to, in the former instance as indicated above, 3.4 V. This voltage is in excess of that supplied to the base of transistor 21 by reference voltage source 24 so that transistor 20 will be in the "on" condition while transistor 21 will be in the "off" condition. Thus, collector current will flow in transistor 20 bringing the voltage at the junction of resistors 27 and 28 to a voltage lower than that supplied by interconnection 18, but to a voltage still sufficient to place transistor 32 in the "on" condition through the emitter-follower circuit including transistor 29.

This voltage at the junction of resistors 27 and 28 keeping transistor 32 in the "on" condition through transistor 29 is lower than the voltage that would be supplied if there were a short circuit provided in place of diodes 25 and 26 and resistor 27. This lowered voltage has been chosen to operate the base of transistor 29 when that interconnection pair 14 connected to discharger circuit 15 is also connected to a selected row 12 of memory cells 13 to prevent transistor 32 from being driven into saturation as it is caused to go into the "on" condition, as will be discussed below. If such a saturation of transistor 32 occurs and that standby line 14" connected to its collector reaches its low value, transistor 32 could operate in the inverse mode so that it actually drew current from current source 16. If the inverse mode is not reached, but nearly is, the current for discharging standby line 14" through transistor 32 could be significantly reduced thus lengthening the time of discharge.

A higher voltage at the base of transistor 20 leading to a higher voltage at the base of transistor 29, which leads to a higher voltage on the base of transistor 32, switches this transistor into the "on" condition to cause it to draw current from standby line 14" during the time that this line and its corresponding word line 14' are increased in voltage by decoder 11 to select that row 12 of memory cells 13 connected therebetween. Hence, during the time duration in which one of rows 12 of memory cells 13 is in a selected status to permit some memory operation, such as storage or a retrieval of information, that one of dischargers 15 connected between the row line pair 14 also connected to this row, draws current from that standby line 14" therein.

This current continues to be drawn through transistor 32 of discharger circuit 15 even after termination by decoder 11 of the selected status of the row 12 connected to this interconnection line pair 14. The differential amplifier based on transistors 20 and 21 continues to keep transistor 32 in the "on" condition until the voltage on the corresponding word line 14' has been reduced by this termination to being equal to the voltage supplied to the base of transistor 21 by reference voltage source 24. Even then, current continues to be drawn from standby line 14" at the collector of transistor 32 because of gate delay in switching transistors 29 and 32 off, and because of the delay provided by capacitor 33.

Capacitor 33 keeps the base of transistor 29 at a sufficiently high voltage to keep transistor 32 in the "on" condition for sufficient time after the voltage on word line 14' falls to below the reference voltage at the base of transistor 21 to assure complete discharge of the capacitances in memory cells 13 connected between lines 14' and 14" in the corresponding row 12 such as those shown in the memory cell circuit examples in FIG. 1A. The collector-substrate capacitance of the memory cell transistor that is in the "off" condition discharges through the base of the opposite one of those transistors in the cell, the transistor in the "on" condition. The collector for substrate capacitance of that "on" condition transistor is discharged through the collector of that transistor as is the parasitic distributed capacitance of its word line 14'. Various other parasitic capacitances present will discharge through these paths also. A similar capacitance 33 in the discharger 15 circuit, connected to the interconnection pair 14 connected in turn to the newly selected row 12, slows the switching on of the transistor 32 in that discharging circuit so that it does not draw discharge current before the discharge current in the discharging circuit 15 involved with the previously selected row 12 has essentially ended.

Figure 3:
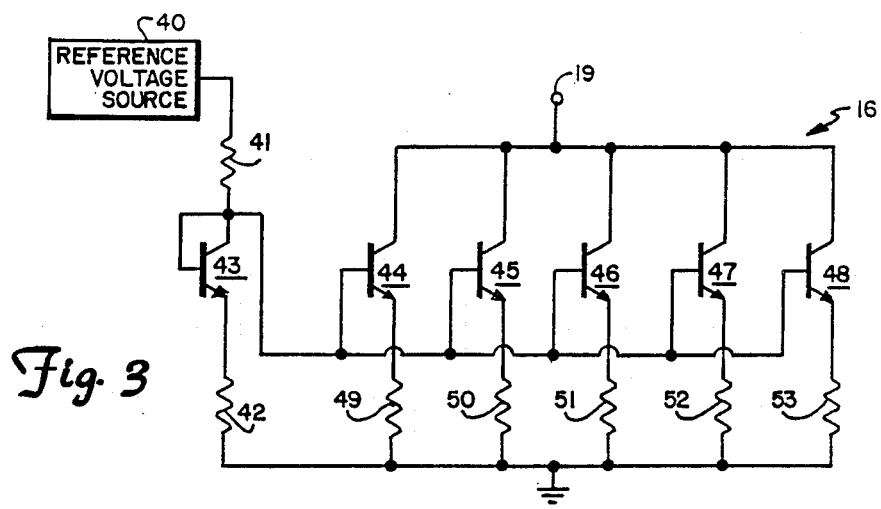
FIG. 3 shows a schematic circuit diagram of a block in Figure 1.

FIG. 3 shows a schematic diagram of the circuit serving as current sink 16. A voltage reference source, 40, provides a voltage, compensated to remain substantially constant with changes in temperature, to a series combination of a pair of resistors, 41 and 42, which are each in series with an npn diode-connected bipolar transistor, 43, connected therebetween. Transistor 43 has its collector and base connected to resistor 41 and its emitter connected to resistor 42. Resistors 41 and 42 typically have resistance values of 500 Ω and 60 Ω, respectively. The voltage developed at the collector of transistor 43 is applied to the bases of a series of further npn bipolar transistors, 44, 45, 56, 47 and 48. Each of these transistors has a corresponding resistor, 49, 50, 51, 52 and 53 connecting its emitter to ground. Each of these resistors has the same resistance value as resistor 42. The collectors of the rest of transistors 44 through 48 are connected to interconnection 19.

Thus, the currents drawn by each of transistors 44 through 48 "mirror" that being drawn through transistor 43. The paralleling of these "mirrored" current sinks based on transistors 44 through 48 in effect provides a current gain for the usable current being drawn through the collectors of the transistors connected to interconnection 19 over the value of the command current being drawn through transistor 43. This command current provides no benefit for the operation of the circuit other than setting the current value through the other transistors, and so should be kept small. Hence, the current gain provided by the use of transistors 44 through 48 permits drawing the value of current desired at terminal 19 even though a relatively small current flows through transistor 43.

Although the present invention has been described with reference to preferred embodiments, workers skilled in the art will recognize that changes may be made in form and detail without departing from the spirit and scope of the invention.

What is claimed is:

1. A discharge circuit for memory cell selection interconnection line pairs each having first and second interconnection members and each operated by a decoder means in a memory circuit, said memory circuit having multiple pluralities of such memory cells with each plurality being electrically connected between said first and second interconnection members in a corresponding one of said interconnection line pairs, including a first plurality of memory cells electrically connected between said first and second interconnection members of a first said interconnection line pair, said discharge circuit comprising:

a first voltage difference sensing means having first and second inputs and an output with said first input thereof being electrically connected to said first pair second interconnection member and said second input thereof terminal means adapted for connection to a first source of voltage, said first voltage difference sensing means being capable of providing an output signal value on said output thereof in a first value range for one polarity of voltage difference between any voltages provided on said first and second inputs thereof but an output signal value in a second value range for an opposite voltage difference polarity; and a first controlled current sink means having first and second current pass regions and having a control region therein by which said first controlled current sink means is capable of being directed, through electrical energization thereof, to effectively provide a conductive path of a selected conductivity between said first controlled current sink means first and second current pass regions, said first controlled current sink means first current pass region being electrically connected to said first pair second interconnection member, said first controlled current sink means second current pass region being electrically connected to a second terminal means adapted for connection to a second source of voltage, said first controlled current sink means control region being electrically connected to said first voltage difference sensing means output.

2. The apparatus of claim 1 wherein a second one of said pluralities of memory cells is electrically connected between said first and second interconnection members on a second said interconnection line pair, and said discharge circuit further comprises a second voltage difference sensing means having first and second inputs and an output with said first input thereof being electrically connected to said second pair first interconnection member and said second input being electrically connected to a third terminal means adapted for connection to a third source of voltage, said second voltage difference sensing means being capable of providing an output signal value on said output thereof in a first value range for one polarity of voltage difference between any voltages provided on said first and second inputs thereof but an output signal value in a second value range for an opposite voltage difference polarity; and a second controlled current sink means having first and second current pass regions and having a control region therein by which said second controlled current sink means is capable of being directed, through electrical energization thereof, to effectively provide a conductive path of a selected conductivity between said second controlled current sink means first and second current pass regions, said second controlled current sink first current pass region being electrically connected to said second pair second interconnection member, said second controlled current sink means second current pass region being electrically connected to a fourth terminal means adapted for connection to a fourth source of voltage, said second controlled current sink means control region being electrically connected to said second voltage difference sensing means output.

3. The apparatus of claim 1 wherein said first voltage difference sensing means comprises a differential amplifier.

4. The apparatus of claim 1 wherein said first controlled current sink means comprises a first current path impedance control means having first and second terminating regions and having a control region therein by which said first current path impedance control means is capable of being directed, through electrical energization thereof, to effectively provide a conductive path of a selected conductivity between said first current path impedance control means first and second terminating regions, said first current path impedance control means first terminating region serving as said first control current sink means first current pass region, said first current path impedance control means control region being electrically connected to said first controlled current sink means control region, and wherein said first controlled current sink means further comprises a discharge current sink means having first and second terminating regions and being capable of drawing current of a selected value therebetween, said discharge current sink means first terminating region being electrically connected to said first current path impedance control means second terminating region, and said discharge current sink means second terminating region serving as said first current controlled current sink means second current pass region.

5. The apparatus of claim 2 wherein there is provided a plurality of voltage difference sensing means each having first and second inputs and an output, including first and second voltage difference sensing means, said first input of each of said plurality of voltage sensing means being electrically connected to a first interconnection member of a corresponding said interconnection line pair and each said second input thereof being electrically connected to said first terminal means which is in common with said third terminal means so that said first and third sources of voltage are common sources, each said first voltage difference sensing means being capable of providing an output signal value on said output thereof in said first value range for one polarity of voltage difference between any voltages provided on said first and second inputs thereof but an output signal value in a second value range for an opposite voltage difference polarity on those said inputs thereof; and a plurality of controlled current sink means, including said first and second controlled current sink means, each having first and second current pass regions and a control region therein by which it is capable of being directed, through electrical energization thereof, to effectively provide a conductive path of a selected conductivity between its said first and second current pass regions, each of said controlled current sink means having its first current pass region electrically connected to a second interconnection member in a corresponding said interconnection line pair, each second current pass region of a said controlled current sink means being electrically connected to a said second terminal means which is in common with said fourth terminal means so that said second and fourth sources of voltage are a common source, and each control region of a said controlled current sink means being electrically connected to a said output of that one of said voltage difference sensing means also electrically connected to that same said interconnection line pair.

6. The apparatus of claim 3 wherein said differential amplifier comprises a pair of differential bipolar transistors each having an emitter thereof electrically connected to a collector of a first current sink bipolar transistor having its emitter electrically connected through a first resistor to said second terminal means and its base electrically connected to a third terminal means adapted for connection to a third source of voltage, said pair of differential bipolar transistors having a collector of one electrically connected to a fourth terminal means adapted for connection to a fourth source of voltage with its base serving as said first voltage difference sensing means first input, and that remaining one of said pair of differential bipolar transistors having a collector thereof electrically connected through a second resistor to said fourth terminal means with its base serving as said first voltage difference sensing means second input.

7. The apparatus of claim 4 wherein said first current path impedance control means control region is electrically connected to said first controlled current sink means control region through an amplifier means.

8. The apparatus of claim 5 wherein each of said plurality of current sink means comprises a corresponding current path impedance control means having first and second terminating regions and having a control region therein by which it is capable of being directed, through electrical energization thereof, to effectively provide a conductive path of a selected conductivity between its said first and second terminating regions, said first terminating region of each of said current path impedance control means serving as said first current pass region of its corresponding controlled current sink means, said control region of each of said current path impedance control means being electrically connected to said control region of its corresponding controlled sink means, and further comprising a discharge current sink means having first and second terminating regions and which is capable of drawing a current of a selected value at said first terminating region thereof to be passed out of said second terminating region thereof, said second terminating region of each of said current path impedance control means being electrically connected to said discharge current sink means first terminating region, said discharge current sink means second terminating region serving as said second current pass region of each of said plurality of current sink means.

9. The apparatus of claim 6 wherein said second resistor, where connected to said collector of said one of said pair of differential bipolar transistors, is further electrically connected to the base of a current amplifying bipolar transistor having its collector electrically connected to a fifth terminal means adapted for electrical connection to a fifth source of voltage and its emitter electrically connected to the collector of a second current sink bipolar transistor having, in turn, its emitter electrically connected through a third resistor to said second terminal means, said second current sink bipolar transistor having its base electrically connected to a sixth terminal means adapted for electrical connection to a sixth source of voltage.

10. The apparatus of claim 8 wherein each of said current path impedance control means has its control region electrically connected to its corresponding controlled current sink means control region through an amplifier means.

11. The apparatus of claim 9 wherein said emitter of said current amplifying bipolar transistor is also electrically connected to the base of a current path impedance control bipolar transistor having its collector serving as said first controlled current sink means first current pass region, and its emitter electrically connected to the collector of a first discharge current sink bipolar transistor having its emitter electrically connected through a fourth resistor to said second terminal means, said first discharge current sink bipolar transistor base being electrically connected to a voltage reference means.

12. The apparatus of claim 11 wherein there are a plurality of discharge current sink bipolar transistors, including said first discharge current sink bipolar transistor, each having its collector electrically connected to that of the others in common and each having its base electrically connected to that of the others in common, said emitters of each being electrically connected through a corresponding resistor to said second terminal means including said fourth resistor being so connected from the emitter of said first discharge current sink bipolar transistor.

* * * * *

UNITED STATES PATENT AND TRADEMARK OFFICE
CERTIFICATE OF CORRECTION

PATENT NO. : 4,951,255

DATED : August 21, 1990

INVENTOR(S) : James B. Hobbs

It is certified that error appears in the above-identified patent and that said Letters Patent is hereby corrected as shown below:

Column 2, line 62, "14,," should read -- 14'' --.

Column 3, line 25, "current sink " should read
-- current sink 16. --.

Column 5, line 56, "by decoder A sufficient" should read
-- by a decoder 11. A sufficient --.

Column 6, line 22, "connected thereto" should read
-- connected thereto. --.

Claim 1, column 8, line 28, "thereof terminal" should read
-- thereof being electrically connected to a first terminal --.

Signed and Sealed this

Tenth Day of December, 1991

Attest:

HARRY F. MANBECK, JR.

*Attesting Officer*  *Commissioner of Patents and Trademarks*